United States Patent
Ku et al.

(10) Patent No.: US 9,786,753 B2
(45) Date of Patent: Oct. 10, 2017

(54) SELF-ALIGNED DUAL TRENCH DEVICE

(71) Applicant: Diodes Incorporated, Plano, TX (US)

(72) Inventors: Yun-Pu Ku, New Taipei (TW); Chiao-Shun Chuang, Zhubei (TW); Cheng-Chin Huang, Plano, TX (US)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 14/797,290

(22) Filed: Jul. 13, 2015

(65) Prior Publication Data

US 2017/0018619 A1     Jan. 19, 2017

(51) Int. Cl.
*H01L 29/423* (2006.01)
*H01L 29/40* (2006.01)
*H01L 21/762* (2006.01)
*H01L 29/78* (2006.01)
*H01L 29/872* (2006.01)

(52) U.S. Cl.
CPC .... *H01L 29/4236* (2013.01); *H01L 21/76224* (2013.01); *H01L 21/76229* (2013.01); *H01L 29/407* (2013.01); *H01L 29/7827* (2013.01); *H01L 29/8725* (2013.01)

(58) Field of Classification Search
CPC ............... H01L 29/4236; H01L 29/861; H01L 29/7828; H01L 29/66356; H01L 29/7391; H01L 29/872; H01L 29/8725; H01L 29/7392; H01L 29/42368; H01L 29/7813; H01L 29/66734; H01L 21/76224; H01L 21/763; H01L 21/76229; H01L 27/0262; H01L 27/1083; H01L 27/10879

See application file for complete search history.

(56) References Cited

U.S. PATENT DOCUMENTS

| | | | |
|---|---|---|---|
| 6,352,931 B1 * | 3/2002 | Seta | H01L 21/31116 257/E21.252 |
| 6,426,233 B1 * | 7/2002 | Knappenberger | H01J 9/025 216/11 |
| 6,429,481 B1 | 8/2002 | Mo et al. | |
| 6,710,403 B2 | 3/2004 | Sapp | |
| 8,748,976 B1 | 6/2014 | Kocon et al. | |
| 2003/0232483 A1 * | 12/2003 | Fujiishi | H01L 27/10894 438/396 |
| 2004/0021173 A1 * | 2/2004 | Sapp | H01L 29/7813 257/330 |
| 2006/0252257 A1 * | 11/2006 | Ahn | H01L 21/76232 438/637 |
| 2008/0164516 A1 * | 7/2008 | Darwish | H01L 29/0649 257/329 |
| 2010/0078707 A1 * | 4/2010 | Haeberlen | H01L 29/7805 257/328 |
| 2010/0264486 A1 * | 10/2010 | Denison | H01L 29/42368 257/330 |

(Continued)

*Primary Examiner* — Galina Yushina

(57) ABSTRACT

A power MOSFET or a power rectifier may be fabricated according to the invention to include a gate trench and a field plate trench. Both trenches can be formed with a two-step etching process as described in detail in the specification. The devices that embody this invention can be fabricated with higher packaging density and better and more tightly distributed device parameters such as the $V_F$, $R_{DSS}$, and BV.

12 Claims, 9 Drawing Sheets

(56) References Cited

U.S. PATENT DOCUMENTS

2011/0143519 A1\* 6/2011 Lerner .................. H01L 21/743
                                                                       438/433
2012/0043602 A1\* 2/2012 Zeng ................... H01L 29/0623
                                                                       257/330

\* cited by examiner

SELF-ALIGNED DUAL TRENCH DEVICE

BACKGROUND OF THE INVENTION

Traditionally, integrated circuits (IC) are built on or near the top surface of semiconductor chips. Electrical currents in the IC flow in and between circuit-elements in parallel and close to the chip surface and certain locations in the surface areas are susceptible to stress from strong electric fields and high currents during the operation of the IC.

Recently, some circuit elements have been disposed away from the chip surface towards the bulk of the chip as a way to spread the current in order to reduce the resistance to current flow, and also to redirect the electric field away from the chip surface in order to increase the device operating voltage. As a result, trench structures are gaining popularity in power MOSFETs and rectifiers and transient voltage suppressing devices. This class of devices is commonly referred to as vertical devices or vertical ICs.

In some vertical ICs all trenches are of the same depth, such as D5V0L1B2DLP3, a 6 V, 6 A, 15 pF Zener TVS by Diodes Incorporated. In those devices, the trenches are defined with a single photo-mask and etched concurrently. In other vertical integrated circuits the trenches are of different depths, such as the MOSFET described in the U.S. Pat. No. 8,748,976 (the '976 patent). In the MOSFET disclosed in the '976 patent there are vertical RESURF trenches and gate trenches, which are of different depths and they are defined separately using a dedicated RESURF trench mask and a dedicated gate trench mask.

SUMMARY OF THE INVENTION

The inventors studied the various known vertical devices including vertical power MOSFETs with trenches of different depths and discovered that such devices tend to vary in performance even among the devices that are from the same production lot or even from the same wafer. The inventors recognized that not only is this excessive variation undesirable but also unavoidable. This is because when the trenches are formed using more than one photo-mask, there will be inevitable misalignment between the masks and consequently the relative placement between trenches becomes difficult to control. The misalignment is the root cause of the device-to-device variation and it will become more pronounced as the design rule continue to shrink and the spacing between trenches and the relative placement of the trenches become increasingly critical.

The effect of misalignment is that many device parameters, such as $V_F$, $R_{DSON}$, and $BV_{DSS}$ of MOSFETs tend to deviate from the designed value. As a result, when using such devices in a system, the uncertainty of the MOSFET parameters necessitates wider system design tolerance.

In order to solve this vexing problem, the Inventors endeavored to invent a method with which misalignment between trenches of different depth and different width can be practically eliminated and this is achieved using the manufacturing equipment that is presently available to the skilled artisans.

In this paper, a dual-trench structure will be described as an example to assist skilled artisans in understanding and using this invention. The exemplary dual-trench structure may be incorporated in a MOSFET, in a rectifier, or in other IC circuits. The inventive concept is briefly summarized as follows.

In an integrated circuit, trenches may be used for different purposes. For example, in MOSFET structures similar to that in '976 patent, trenches are used both as RESURF structure and as gate structure. The RESURF trenches need to extend to the full length of the drift region to be effective in reducing electric field in the device. The gate trenches, on the other hand, need only to reach the drift region and should be kept as short as possible in order to reduce gate to drain capacitance. The different requirements dictate that the gate trench be only fractions of the RESURF trench in length. And the different electrical voltages that are forced on the two trenches during device operation necessitate different trench widths in addition to different trench depths.

The Inventors recognized that by taking advantage of the dimensional difference of the trenches, the two trenches may be defined by using one photo mask but etched with a two-step etching process so both can reach their respective designed depths. And because both trenches are printed with a single masking step, there can be no, misalignment between the two trenches, The following paragraphs briefly describe the process steps the chip goes through after both trenches are defined with the same photomask.

First, after an initial trench etching step, the chip gets a thin film deposited on it. Thin films are commonly used in IC manufacturing process. For example, doped polysilicon may be used in occasions when a conductive film is called for; and silicon dioxide film is often used for insulating between conductive materials such as silicon and metals. In this exemplary dual-trench device, polysilicon is deposited in both trenches, which are lined with silicon dioxides. The deposited polysilicon film is thicker than the half width of the gate trench, which is narrower than the field plate trench. The polysilicon film covers the bottom and the shoulder of the wider trench but completely filled the narrow trench to its full depth.

When the deposited polysilicon film is etched back with an isotropic etching process, the polysilicon film in the wider trench will be completely removed and the polysilicon in the gate trench remains but is recessed a certain predetermined depth from the mouth. In a following process step, the recess is filled by a dielectric film such as a silicon dioxide film. This film is then etched back from chip surface with only a portion left in the recess to serve as a hard mask to shield the remaining polysilicon in the gate trench during the second of the two-step trench etching process.

The second etch step removes the silicon from the wider trench to a new trench depth while the narrower gate trench and the mesa region between the trenches are shield from the etching by a hard mask. This will be explained more fully in a later section. With this method, both wide and narrow trenches are defined with the same photo mask and the depths of the two trenches can be controlled independently and with virtually no misalignment between the two trenches. Many electronic devices can be fabricated following this novel trench formation process. Several examples will be described below. Integrated circuit devices that embody this invention do not have the problem of parameter dispersion due to misalignment between trenches and the device performances are therefore more predictable and more dependable.

DEFINITIONS

Figure 1:
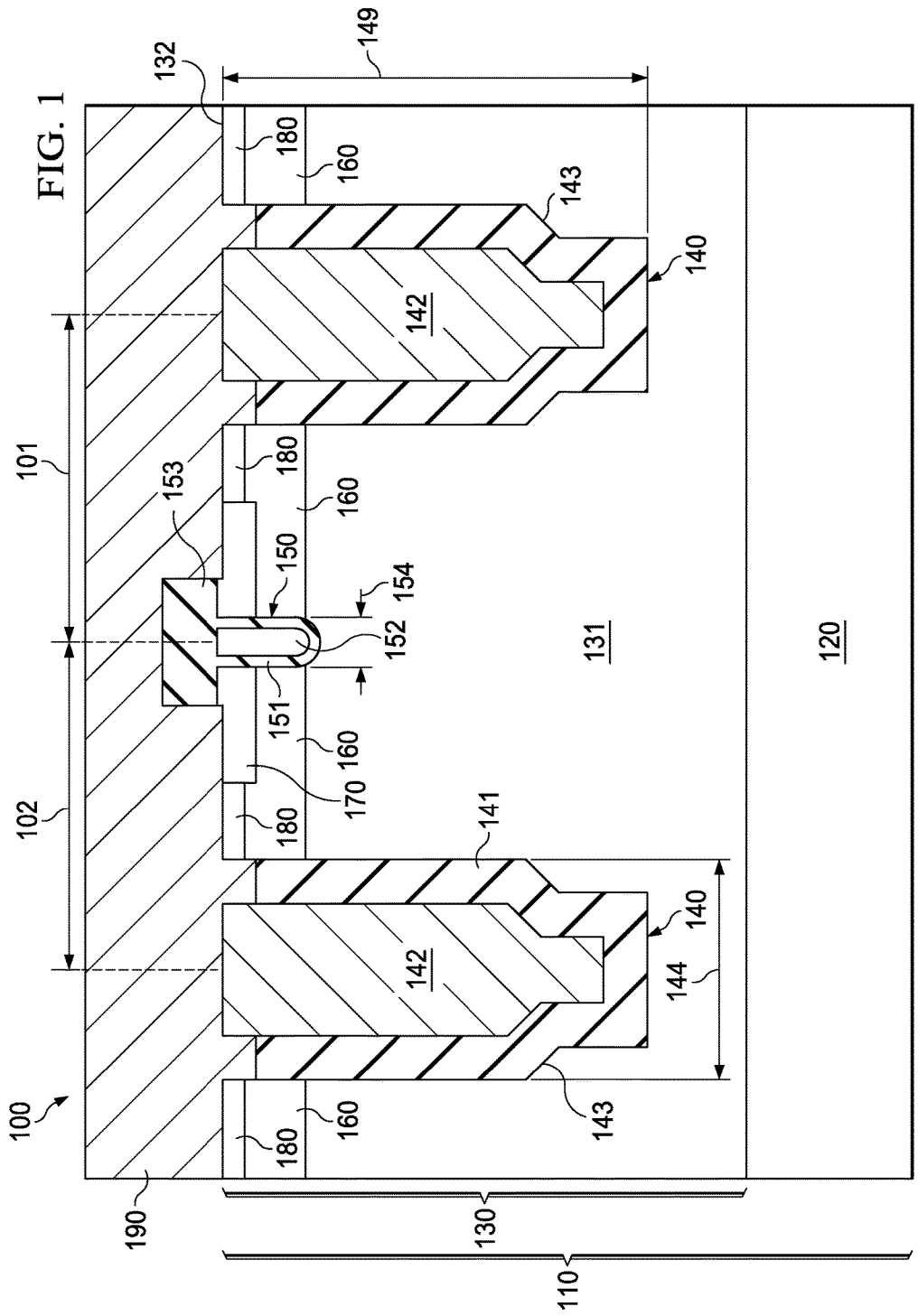
FIG. 1 depicts a cross-section view of a dual-trench device that embodies aspects of this invention.

The terms used in this disclosure generally have their ordinary meanings in the art within the context of the invention. Certain terms are discussed below to provide additional guidance to the practitioner regarding the description of the invention. It will be appreciated that same thing can be said in more than one way. Consequently, alternative language and synonyms may be used.

A semiconductor chip is a slab of semiconducting material such as silicon, germanium, silicon carbide, diamond, gallium arsenide, and gallium nitride. A semiconductor chip usually has two parallel major surfaces, which are major crystallographic planes. Integrated circuits are built in and on the top portion of semiconductor chips; recently, in some integrated circuits, elements have been build perpendicular to the top surface into the bulk of the semiconductor chips. In this disclosure, the term top surface of the chip or chip surface is used to mean the top parallel surface of the semiconductor chip where the semiconductor material comes in contact with other material such as dielectric or conductive films.

A trench is a structural element of certain integrated circuit chips. Trenches are usually formed by first printing an image on the semiconductor chip surface with photoresist, followed by removing material from the chip where it is not protected by the photoresist. The removal of material is usually done with reactive ion etching process. Trenches when viewed from the chip surface usually have long-striped shape. The walls of a trench are the vertical surfaces of the semiconductor material extending from the surface of the chip to the bottom of the trench. In this disclosure, the width of a trench is the distance between two trench walls and the length of the trench is the long dimension that is orthogonal to the width and the depth of the trench. The depth of a trench is measured in a direct perpendicular to the top surface of the chip and is the measurement from the top surface of the chip to the endpoint of the etching step, i.e. the bottom of the trench A MOSFET is a four terminal electronic circuit element. Electrical current can flow in a channel between the source terminal and the drain terminal, and the magnitude of the current may be controlled by the voltages at the gate terminal and at the body terminal. In a MOSFET, current can flow in both directions in the channel. In many trench MOSFETs, the gate is built in the trench, and the body region is shorted internally to the source region.

A Rectifier is a two terminal electrical circuit element. Electrical current can flow between the anode and the cathode depending on the polarity of the voltage across the terminals. In a SBR rectifier made by Diodes Incorporation, it also has a gate structure. SBR rectifier can also be built vertically with trench structure.

A Raised edge in this disclosure refers to the edge or ledge feature on the trench walls that evidences the two-step etching process as described in this paper. Raised edges are parallel to the top surface of the chip and demarcate the two sections of trench walls. The top section of the trench is wider than the bottom section. The raised edge tends to have a smooth surface that slopes down towards the bottom of the trench, characteristic of the reactive ion etching process.

Equal, when uses in this disclosure in connection with the depth of the trenches, means the depths of two trenches are equal to each other as the result of an etch step. Due to what is known in the art as the micro-loading effect of the reactive ion etching process, the etch rate is a function of width of the trench—a wider trench tends to etch faster than a narrower one due to easier transportation of the reactive etching species and the product of the etching reaction. Since there is at least a wider trench and a narrower trench in the exemplary devices disclosed in this paper, the depths of narrow trench and the wide trench may not be mathematically equal when they are etched for the same length of time but for the purpose of describing and claiming this invention, the trench depths are regarded as being "equal."

Equidistant, when referring to the distance between trenches in this disclosure, means that in a cross section view the distances between the centerlines of a trench pair is equal to the distance between the centerlines of another trench pair.

Epitaxial layer (epi-layer) in this disclosure refers to a layer of single crystal semiconductor formed on a substrate of, for example, another single crystal semiconductor layer by epitaxial growth. Dopant may be incorporated into an epi-layer during its formation or after its formation. Integrated circuit elements are usually built in an epi-layer.

Source and Drain in a MOSFET refer to the source and drain terminals or the two semiconductor regions that are connected to the respective terminals. MOSFET is a bi-directional device in the sense that current can be manipulated to flow either from source to drain or from drain to source. In a vertical MOSFET, the drain can either be at the top of the chip surface in a configuration known as source-down, or at the bottom of the chip in a configuration known as drain-down.

Forward Voltage ($V_F$) of a MOSFET or a rectifier is the measurement of voltage at the device when the rated current is flow through it. It is a figure of merit in power devices as it represents the power loss ($IV_F$) due to ohmic heating when the device is forward driven.

On-resistance ($R_{DSON}$) of a MOSFET or a rectifier is the measurement of current when the device is forward driven. It is a figure of merit in power devices as it represents the power loss due to ohmic heating ($I^2R_{DSON}$).

Block voltage (BV) of a MOSFET or a rectifier is the measurement of the maximum voltage across a reverse biased junction of a device before it enters into the "breakdown" mode. It is a figure of merit in power devices as it represents the maximum operation voltage of the device Field plate in a power MOSFET or a rectifier is a conductive element disposed near a p-n junction that when properly biased can effectively alter the electrical field distribution near the p-n junction to increase its breakdown voltage. The field plate may be a polysilicon structure at the surface of the device or inside a field plate trench. The field plate trench in a vertical MOSFET is designed to increase the breakdown voltage between the body region and the substrate.

Photomask is a tool used in traditional semiconductor manufacturing. It is usually made of a flat and transparent material. On the mask is a pattern of opaque material that is intended to be transferred to wafers. In this disclosure, photomask includes more advanced equivalent photolithographic tool such as e-beam writing that imprints a pattern on wafers without using the traditional photomasks.

DETAIL DESCRIPTION OF EXEMPLARY IMPLEMENTATIONS OF THIS INVENTION

Example One

A Power MOSFET

FIG. 1 depicts a cross section view of a semiconductor chip with a MOSFET device 100 that embodies certain aspects of this invention. The MOSFET 100 comprises repetitive cells 101 and 102. In the middle of FIG. 1 is a gate trench 150. On either side of the gate trench is a field plate trench 140. The bottom portion of the semiconductor chip is the substrate 120, which serves as the drain of the MOSFET. In this example the substrate is heavily doped single crystal silicon. A person skilled in the art should appreciate that semiconductor materials other than silicon may also be used to implement this invention. Examples are germanium, diamond, silicon carbide, gallium arsenide, gallium nitride, and mercury cadmium telluride, etc.

Layer 130 is a single-crystal silicon epitaxial layer (epi-layer), which incorporates other chemical elements to modify the characteristics of the MOSFET. Such elements include germanium, boron, phosphorous, arsenic, and aluminum, etc. In this example the MOSFET is an n-type MOSFET, that means the dominate dopant in the substrate and in the epi-layer is n-type. A skilled person should be able to follow the description to make p-type MOSFETs with a change of dopant polarity.

Layer 160 is the body region, which is a p-type layer incorporated into the epi-layer 130 by processes such as ion implantation. Layer 160 may also be a separate p-type epi-layer grown over the n-type epi-layer. Region 180 is a more heavily doped p+ region in the body region. The heavy doping is to facilitate ohmic contact formation between the silicon and the metal layer 190. The MOSFET 100 also has a source region 170, which is a heavily doped n-region and which butts against the wall of the trench 150.

Trench 150 is the gate trench. The trench is formed in this example by reactive ion etch process, and the width 154—distance between the opposite walls of the trench—is about 0.45 µm and the depth is about 1 µm. The walls of the trench are lined with a dielectric material 151 such as silicon dioxide of a thickness of about 0.1 µm. This thickness is picked for device applications in which the gate may experience voltages above 20 V with respect to the drain. The inner portion of the gate trench is about 0.25 µm and is filled with a conductive material such as doped polysilicon 152. The polysilicon is part of the gate electrode and is connected to the gate terminal of the MOSFET, which receive the gate signal that turns the MOSFET on or off.

Two trenches 140 stand on the two sides of the gate trench 150 in this cross section view. In this exemplary MOSFET, conductive material 142 in trench 140 is electrically connected to the source and the body region by the metal element 190 and element 142 functions as a field plate to soften the electric field at the drift region 131. The walls of the trench 140 are lined with a dielectric material 141 such as silicon dioxide that is about 0.6 to 0.8 µm thick. This thickness is picked for devices that may experience voltages of 100 V or higher between the source and the drain. The inner portion of the field plate trench is also filled with a conductive material 142 such as doped polysilicon.

The field plate trench 140 is formed with a two-step etching process, which will be described in more detail in a later section. Because of the novel etching process, both the gate trench and the field plate trench can be printed concurrently with a photo-mask during the manufacturing process. Evidence of the field plate trench 140 being manufactured with a one-mask two-step etching process is the raised edge 143 located on the walls of the field plate trench.

The layer 190 is a metal layer in this MOSFET. The metal layer 190 directly connects the polysilicon 142 portion of field plate trench, the p+ region 180, and the source region 170. The substrate 120 is the drain of the MOSFET. The polysilicon 152 in the gate trench is electrically isolated from the metal layer 190 by a dielectric element 153, which in this example is also silicon dioxide.

When the gate 152 is bias positively above the threshold voltage with respect to the body region 160, this n-type MOSFET forms a vertical conductive channel in the body region next to the gate trench walls to conduct current between the source terminal and the drain terminal through the drift region 131. The theory of MOSFET operation is well known to the person skilled in the art of MOSFETs.

The structure depicted in FIG. 1 includes 2 MOSFET cells 101 and 102 that share the gate trench 150. Two field plate trenches are placed equidistant from the gate trench. Because the gate trench and the two field plate trenches are printed with the same photomask, the two MOSFET cells are mirror images to each other.

Example Two

A Power Rectifier

Alternatively, FIG. 1 depicts a schematic representation of another exemplary power device—a rectifier that embodies some aspects of this invention. A rectifier is a device with two terminals—an anode and a cathode. The trench structure of the rectifier is similar to that of the MOSFET as described in Example One. The doping schedule of the rectifier, however, differs from that of the MOSFET.

In the exemplary n-type rectifier, the drift region 131 in the epi-layer is n-type; and the body region 160 and the region 180 are dominated with p-type dopant. The region 170, in contrast to that of the MOSFET, is also dominated with p-type dopant.

The element 153 in FIG. 1, which is an electrically insulating element in the MOSFET, is absent from the rectifier structure so the metal layer 190 makes direct electrical contact with the polysilicon 152 in the gate trench 150. The metal layer 190 is the anode of the rectifier and the substrate is the cathode. The theory of operation of the rectifier is known to a person skilled in the art of rectifiers and who can also change the polarities of the dopants to make a p-type rectifier following this disclosure.

Example Three

A Schottky Diode

Alternatively, FIG. 1 depicts a schematic representation of another exemplary power device—a Schottky Diode that may coexist with a MOSFET as described in example 1, or with a rectifier as described in example 2, or with both. A Schottky diode is a two-terminal unidirectional device, analogues to the rectifier in Example 2. Common Schottky diodes are made with silicon. In FIG. 1, the anode 190 of the Schottky diode is a metal element that makes ohmic contact to a metal silicide material, for example, platinum silicide. The cathode is a metal element that makes ohmic contact to the n-type silicon region 120. The interface of the metal silicide and the n-type silicon forms a Schottky barrier that allows electric current to pass between the anode and the cathode only in one direction.

To represent a Schottky diode, regions 131, 160, 170, and 180 in FIG. 1 are all semiconductor regions dominated with n-type dopant. Layer 120 is an n-type substrate, 130 is an n-type epi-layer. The regions 160, 170, and 180 may be formed concurrently with one or more ion implantation steps so there may be no detectable boundaries between the regions. The gate structure 150 and its associated components 153, 151, and 152 may be absent in this exemplary Schottky diode device.

Example Four

Formation of a Gate Trench Structure

Figure 2:
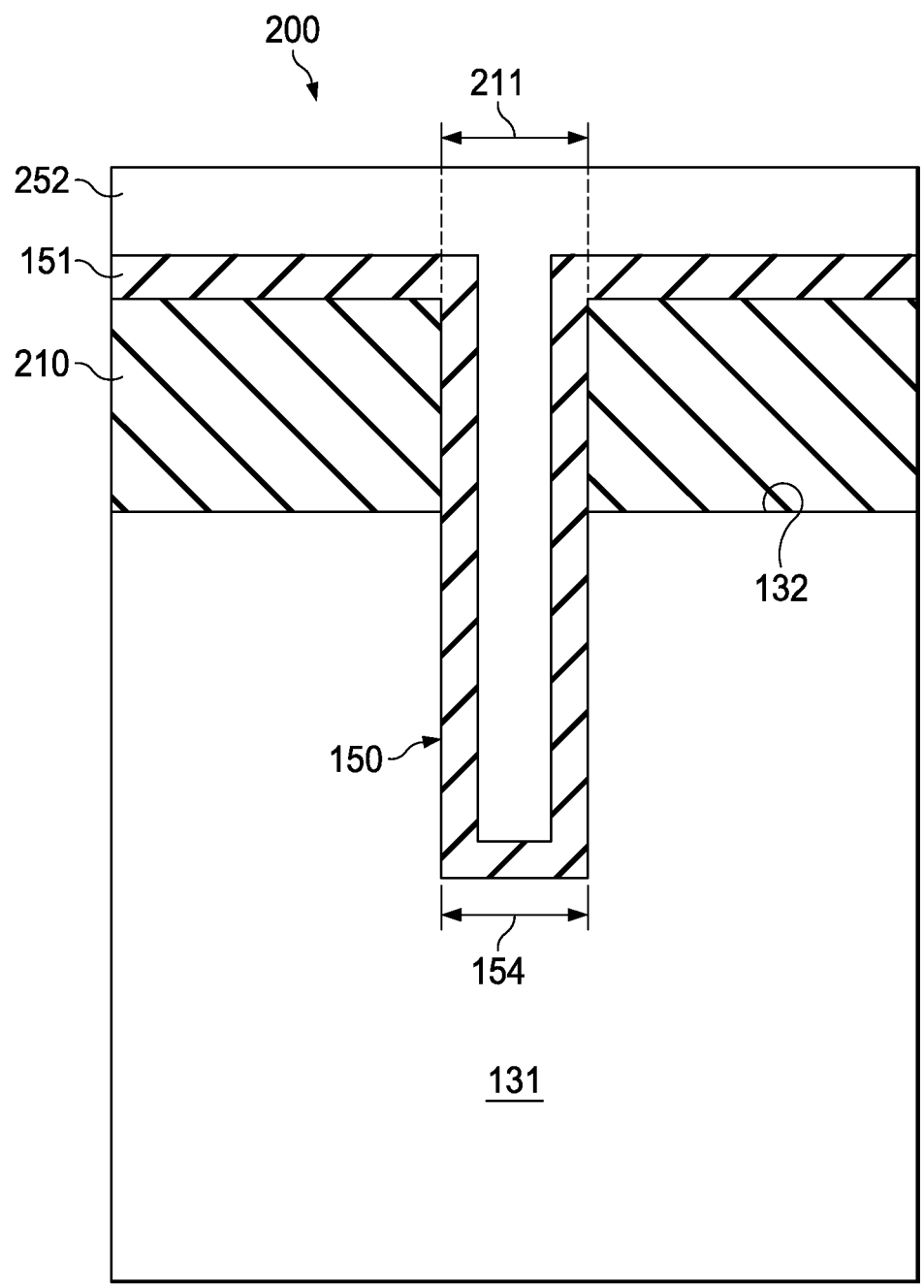
FIG. 2 depicts a cross-section view of an exemplary gate trench at a point of the manufacturing process.
Figure 3:
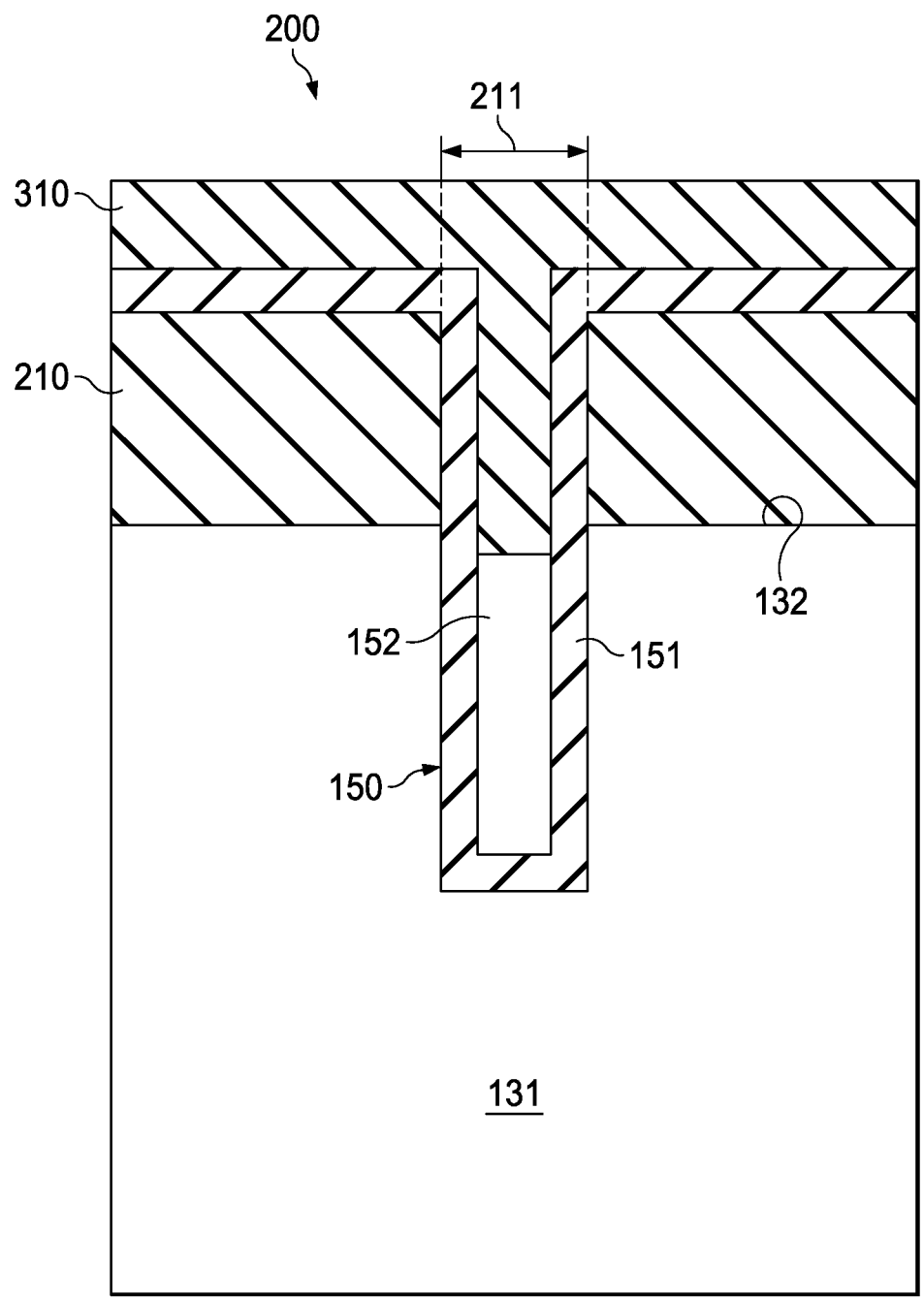
FIG. 3 depicts a cross-section view of the gate trench in FIG. 2 at another point of the manufacturing process.
Figure 4:
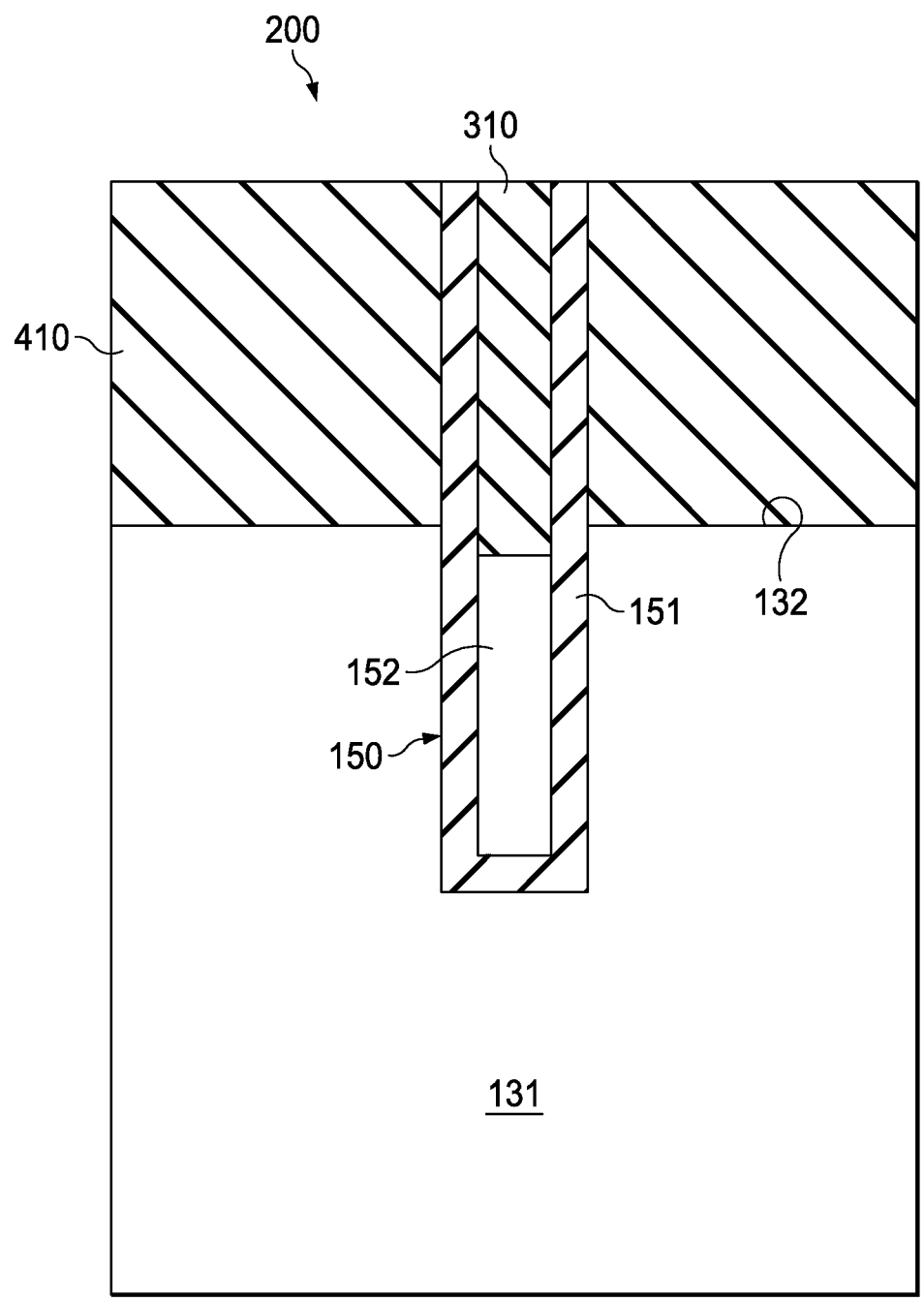
FIG. 4 depicts a cross-section view of the gate trench in FIG. 3 at another point of the manufacturing process.

FIGS. 2, 3, and 4 depict schematic representations of an exemplary process that forms a gate structure 200.

FIG. 2 depicts a partially completed gate structure after a polysilicon film 252 is deposited into the gate trench 150 and on the chip surface 132. At this point of the process flow, there is a hard mask layer 210 covering the shoulder of the gate trench 150, and the trench walls are lined with a dielectric layer 151, which also forms on the hard mask 210. In this exemplary gate structure, the depth of the gate trench is about 1 µm. Hard mask 210 defines the gate and protect the silicon in areas around the gate during the etch process. In this example, the gap 211 between the hard mask 210 on the two sides of the gate trench, which is the width of the gate trench, is about 0.45 µm. In this example, the dielectric material 151 is CVD silicon dioxide. For this power device, of which the gate is designed to stand up to about 20 V, the thickness of the silicon dioxide 151 is picked to be about 0.1 µm. With the formation of the gate dielectric 151, the opening of the trench is reduced to about 0.25 µm. Thermal oxide may also be used to line the gate trench walls.

In a later step, the trench is filled with a conductive material 252, a part of which at the completion of the process will be a part of the gate electrode. In this example, the conductive material is doped polysilicon and the thickness of the polysilicon film as deposited is about 0.3 µm. The polysilicon film should fully fill the gate trench 150. If the deposited polysilicon leaves a seam or craves at the center of the trench, it will not affect the operation of the finished device.

FIG. 3 depicts the device of FIG. 2 at a later point of the process flow. At this point, the deposited polysilicon has been removed from above the top of oxide 210 and from the opening of the trench 150. Element 152 is the remainder of the polysilicon in the trench after the removal step, the top of the polysilicon 152 may be recessed from the surface 132. This removal step is highly preferential and it does not substantially reduce the silicon dioxide film on the chip surface 132.

This step is followed by a deposition of another layer of silicon dioxide 310, which adds to the thickness of the dioxide film over the chip surface 132 and fills the void in the trench 150 above the polysilicon 152, substantially forms a flat surface over the chip. The thickness of the silicon dioxide deposited at the top of the chip is about 0.3 µm so it again fully fills the trench as did the polysilicon in a prior process step. If the deposited oxide leaves a seam or craves, it will be not affect the operation of the finished device.

FIG. 4 depicts the gate trench structure after the oxide film over the chip surface 132 and the gatetrench have been partially removed. The oxide film 410 that is left over the chip surface 132 and the oxide film 310 that is left over the gate trench 150 is sufficiently thick that in the following silicon etching step serves as a hard mask 310 to shield the polysilicon 152 in the gate trench 150 from being etched.

In the process of Example four, silicon dioxide films are used exclusively, either thermally grown or deposited by chemical vapor deposition (CVD), or both. However, other dielectric material such as silicon nitride or silicon oxynitride can also be used.

Example Five

Formation of a Field Plate Trench Structure

Figure 5:
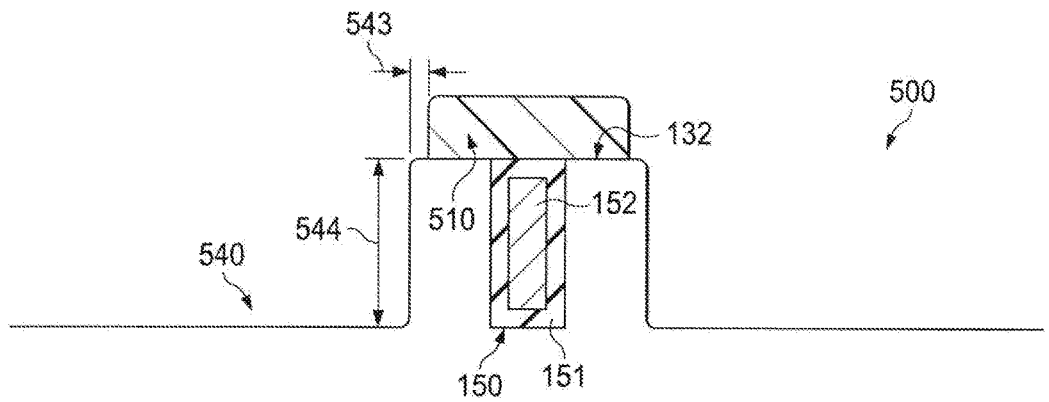
FIG. 5 depicts a cross-section view of an exemplary field plate trench at a point of the manufacturing process.
Figure 6:
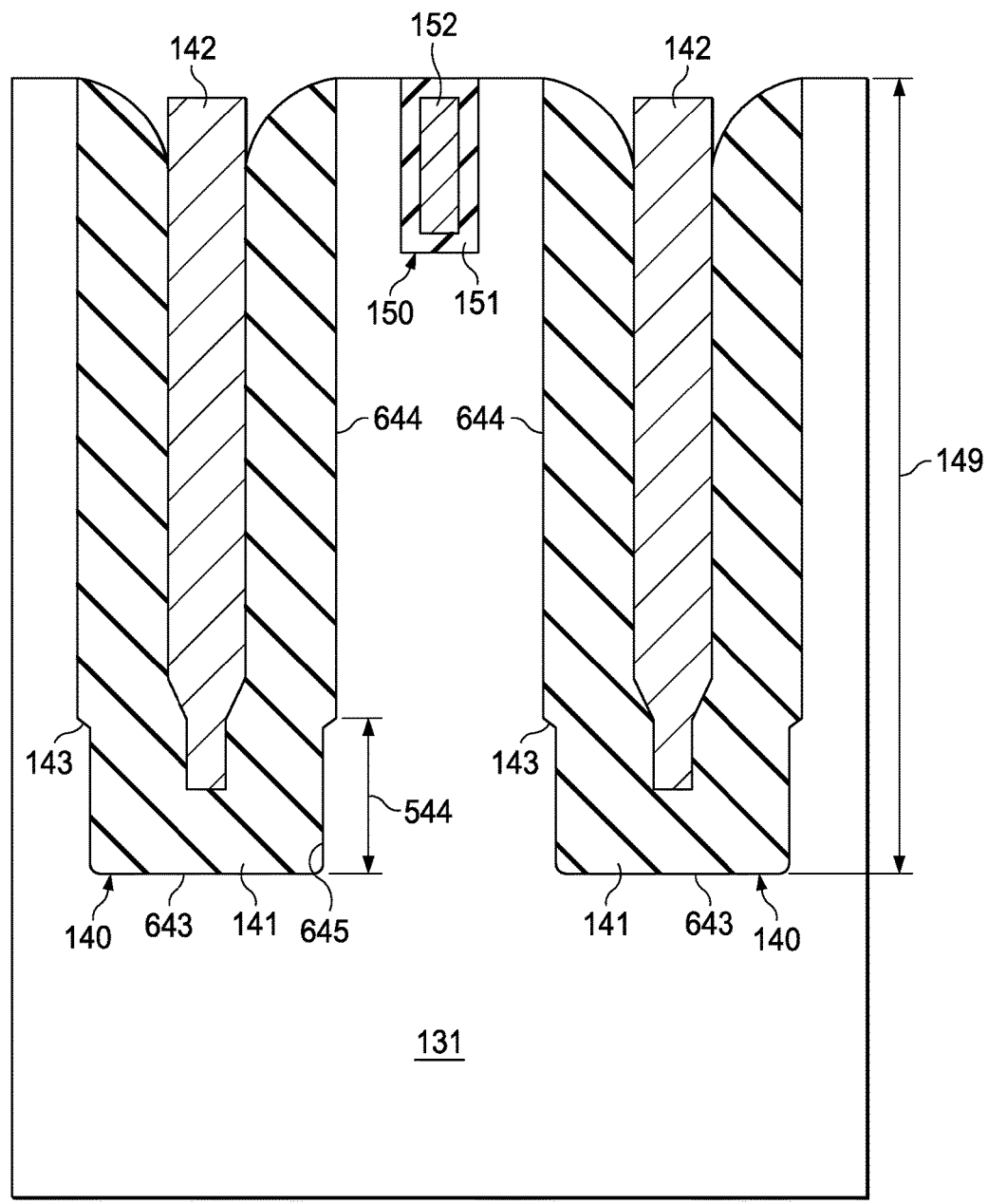
FIG. 6 depicts a cross-section view of the field plate trench in FIG. 5 at another point of the manufacturing process.

FIGS. 5 and 6 depict schematic representations of a process that forms an exemplary field plate structure 500.

FIG. 5 depicts the field plate structure at a point of the process flow following the first etching step of a two-step etching process. At this point of the process, the polysilicon film that was deposited in the field plate trench 140 was completely removed concurrently with the removal of the polysilicon film 252 from the gate trench 150 as depicted in FIG. 2. The silicon dioxide that lines the walls of the field trench beneath the polysilicon film 252 was also removed concurrently with the removal of the oxide film from the top of the silicon chip as depicted in FIG. 4.

In the structure depicted in FIG. 5, there is a lateral recess 543 of the silicon dioxide film 510 from the edge of the field plate trench 540. This is the result of the oxide etching step being isotropic, with which the oxide is removed from the top as well from the edges of the field plate trench 540 at about the equal rate. The recess 543 exposes a portion of the shoulder surface uncovered by the oxide film 510.

The second and final etching step of the two-step etching process is similar to the first and initial etching step in that the etching action is highly directional. Because the oxide film 510 exposes a portion of the shoulder 543 of the field plate trench, the silicon exposed will be etched and removed at about the same rate as the silicon at the bottom of the field plate trench 540. The downward etching action thus creates the raised edge 143 feature and the raised edge 143 and the bottom of the field plate trench advance at the same rate until the etching process is finished and the depth of the field plate trench reaches the predetermined depth.

It should be noted that because the reactive ion etching is highly directional, the distance 544 between the raised edge and the bottom of the field plate trench is preserved at the end of the etching. In other words, the distance 544 is about the same at the initiation of the second etching step as depicted in FIG. 5 as at the completion of the step as depicted in FIG. 6. And this distance is about the same as the depth of the gate trench 150.

FIG. 6 depicts the field plate structure at later point of the process flow. At this point, the field plate trench was etched a second and final time and it has reached the designed depth 149, The walls 644 and 645 and the bottom surface 643 of the field trench are lined with a dielectric film 141. In this example, the film is silicon dioxide, And a conductive material 142 fills the field plate trench.

Because the width 144 (see FIG. 1) of the field plate trench is wider than the width 154 of the gate trench, the field plate trench will etch somewhat faster than the gate trench due to micro-loading effect at the first and initial etch step. In the context of this paper, we recognize but ignore this effect and by approximation equate the depth of the gate trench to the etching depth of the field plate trench after the first etching step.

Example Six

An Alternative Method of Forming a Field Plate Trench

Figure 7:
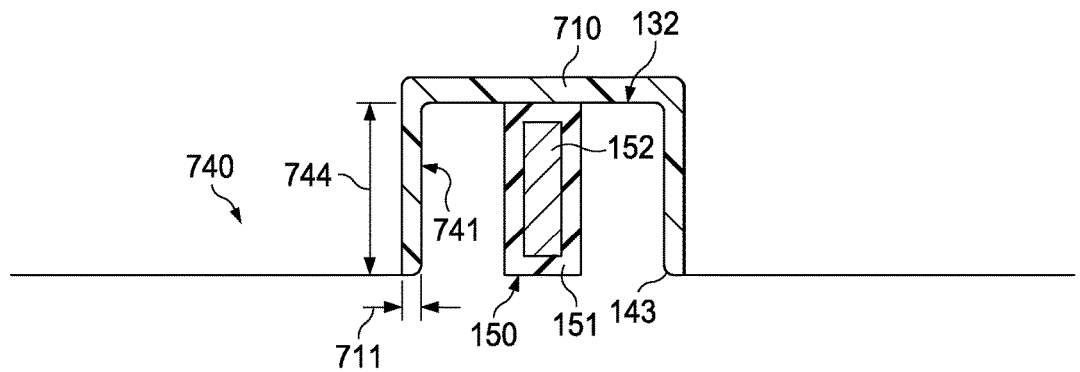
FIG. 7 depicts a cross-section view of an alternative field plate trench of the MOSFET at a point of the manufacturing process.
Figure 8:
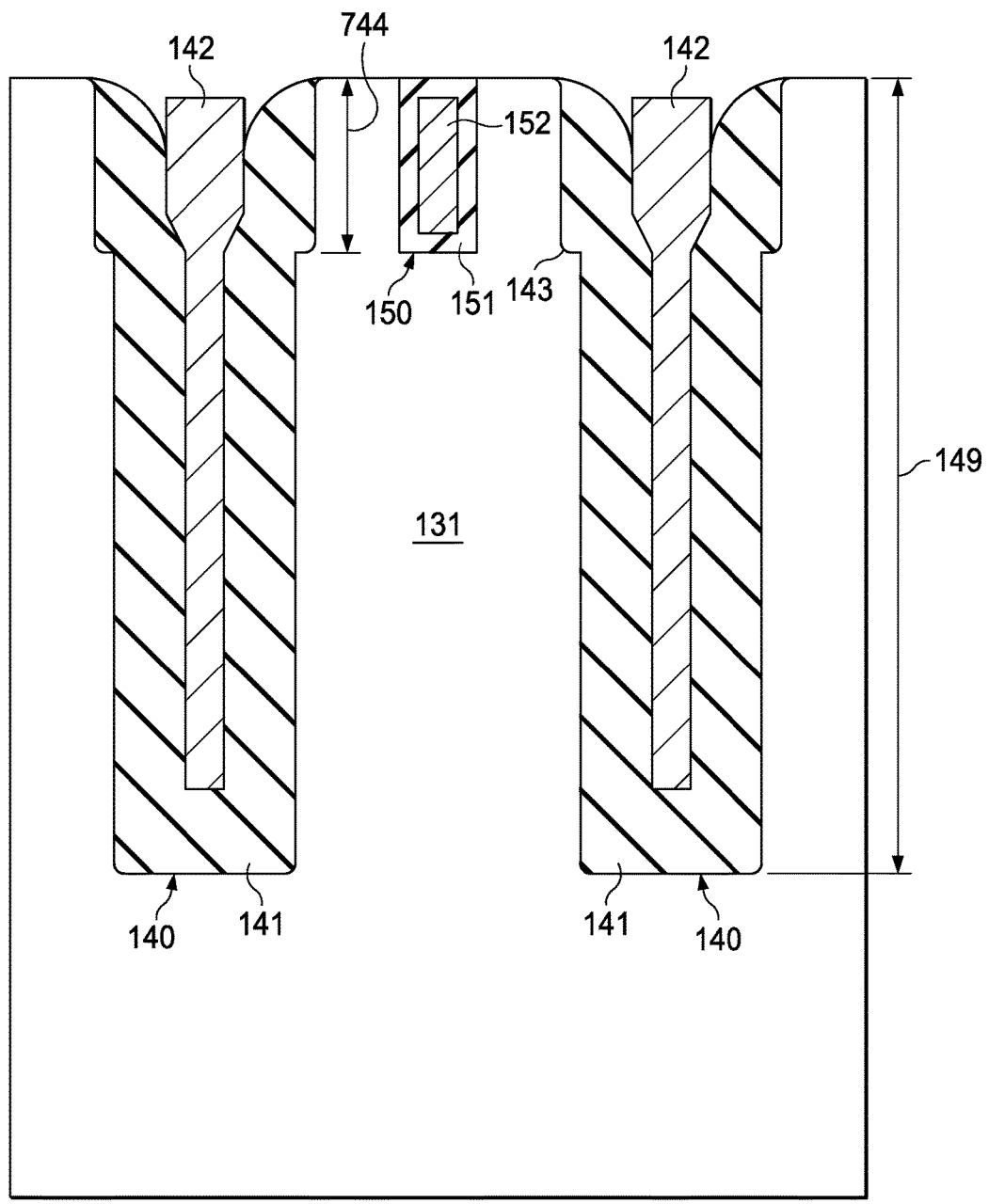
FIG. 8 depicts a cross-section view of the alternative field plate trench in FIG. 7 at another point of the manufacturing process.

FIG. 7 and FIG. 8 depict the schematic representation of an alternative method of forming a field plate trench. In the method described in Example Five, the etching mask 510 is created by partially removing the oxide film with an isotropic etching process, which results in the recessed shoulder 543; in Example Six, the etching mask 710 is created with an anisotropic etching process, which preserves the oxide on the walls of the field plate trench.

FIG. 7 depicts the formation of the hard mask 710 and 711, which in this example is silicon dioxide. The thickness of the hard mask portion 710 that covers the shoulder of the field plate is the remainder of the accumulative of the original hard mask, the gate oxide, and the deposited oxide after the first etching step, which also removes all the silicon dioxide from the bottom of the field plate trench 740.

The etch mask 711 that covers the edge wall 741 of the field plate trench is the accumulation of the gate oxide 151 and the deposited silicon dioxide layer 310. In this example, the thickness of the hard mask 711 is about 0.4 μm thick, which is about the same as that of hard mask 710.

The distance 744 between the chip surface 132 and the bottom of the field plate trench 740 at the beginning of the second etching step is about the same as the depth of the gate trench 150. Because the width 144 (see FIG. 1) of the field plate trench is wider than the width 154 of the gate trench, the field plate trench will etch somewhat faster than the gate trench due to micro-loading effect at the first and initial etch step. In the context of this paper, we recognize but ignore this effect and by approximation equate the depth of the gate trench to the etching depth of the field plate trench after the first etching step.

During the second and final step of the two-step etching process, only the portion of the field plate trench that is uncovered by the oxide element 711 is etched. The raised edge 143 in this example is the bottom portion of the field plate trench that is covered by the etch mask 711. And the distance between the raised edge 143 and the top of the trench is preserved during the second and final etching and is equal to the depth of the gate trench.

FIG. 8 depicts the field plate trench at a later point of the process following the second and final etching of the field plate trench is completed. After the second etching step, the field plate trench is lined with a layer of dielectric material 141. In this example, the liner is silicon dioxide. Since this exemplary structure is designed to sustain up to 100 V, the thickness of the silicon dioxide is chosen to be 0.6 to 0.8 μm.

Finally, the field plate trench is filled with a conductive material 142 for electrically connecting other nodes of the device. In this example, the conductive material is doped polysilicon. Other conductive material such as metal may also be used instead or in combination.

Example Nine

A Photomask

Figure 9:
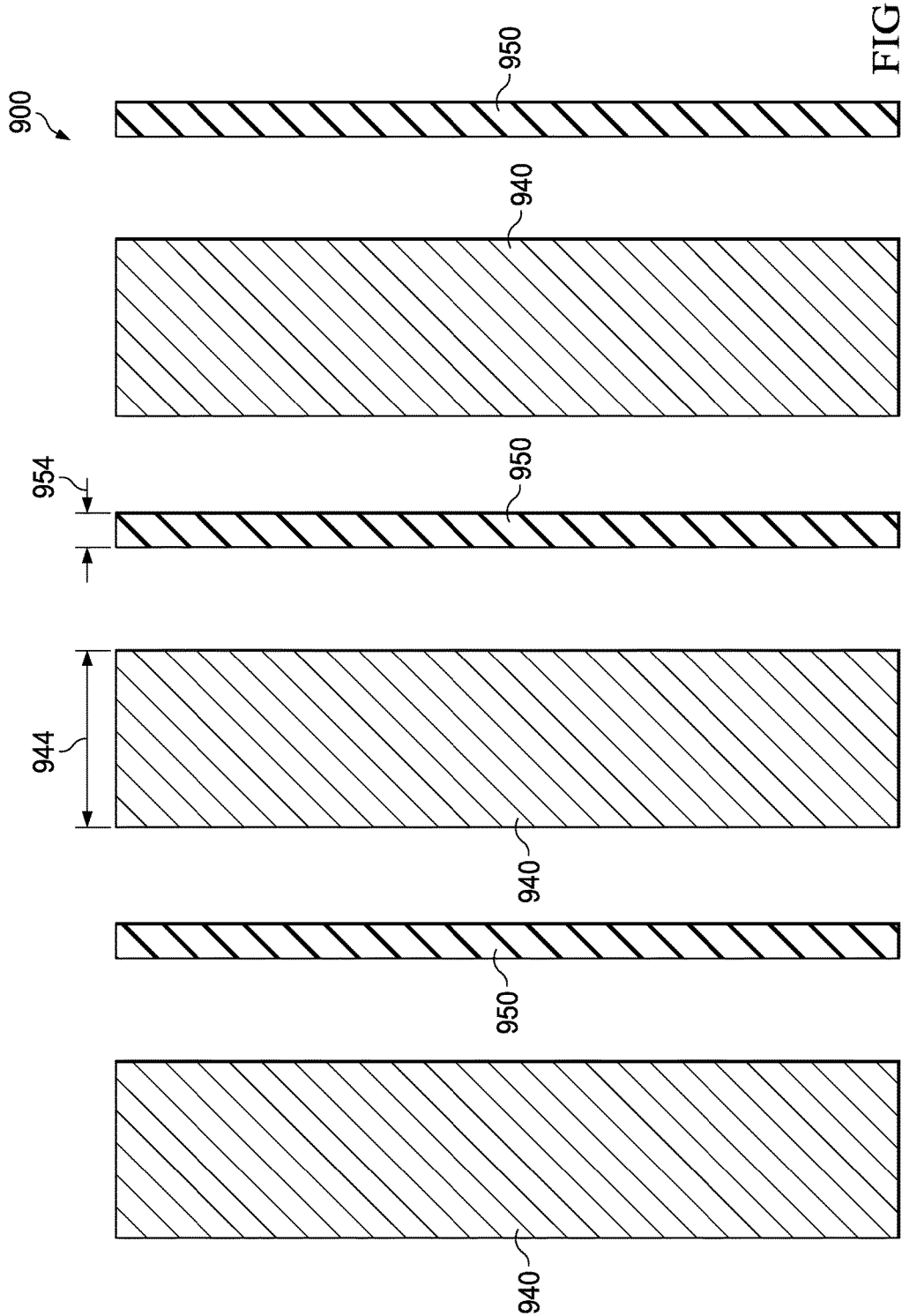
FIG. 9 depicts a schematic representation of a photomask that embodies certain aspects of this invention.

FIG. 9 depicts a portion of a trench mask that embodies some aspects of this invention. FIG. 9 depicts a repetitive pattern of interdigitated gate trenches 950 of width 954 and field plate trenches 940 with width 944. The difference in widths 944 and 954 is representative only.

Traditional photomasks used in semiconductor manufacturing are made of quartz substrate with chrome metal forming the opaque pattern of, for example, the gate trenches 950 and the field plate trenches 940. As the feature size shrinks, chrome and quartz photomasks are being replaced by other techniques to create patterns on semiconductor wafers. One such technique is e-beam writing, in which the pattern is directly "written" on photoresist spread on wafers with electron beams directed by a host computer.

Even though FIG. 9 depicts part of a traditional photomask that creates the two sets of trenches concurrently, this invention is applicable to newer techniques such as e-beam writing because as long as the two sets of trenches are patterned in one photolithographic step, there will be no need to align one pattern to another and therefore misalignment between the two sets of trenches is virtually eliminated.

We claim:

1. A process of forming two adjacent trenches in a chip having top and bottom semiconductor surfaces, comprising:
    etching to remove semiconductor material to form a first trench and an adjacent wider second trench having a bottom and shoulders;
    depositing a first material to fill the first trench to its full depth and to cover the bottom and the shoulders of the second trench;
    removing the first material from the second trench but only partially from the first trench; and
    etching to remove semiconductor material to extend the second trench deeper towards the bottom semiconductor surface, creating a final second trench and forming a raised edge on side walls of the final second trench.

2. The process of claim 1, in which the location of the raised edge measured from a bottom of the final second trench is equal to the depth of the first trench.

3. The process of claim 1, in which the first trench and the final second trench are portions of a MOSFET or a rectifier.

4. A process comprising;
    providing a photomask having a repetitive pattern to be used for creating first trenches and wider second trenches;
    forming on a surface of a wafer an image with the provided photomask;
    etching to remove semiconductor material to form in the wafer a first trench and a top part of a wider second trench;
    depositing a first film covering a bottom and a shoulder of the second trench's top part but completely filling the first trench to its full depth; and
    conducting a second etching to remove semiconductor material and creating a second trench extending deeper than its top part and forming a raised ledge a first distance from a bottom of the second trench and a second distance from the wafer surface.

5. The process of claim 4, further comprising a removing step with which the first film is completely removed from the second trench but only recessed a certain depth in the first trench.

6. The process of claim 5, further comprising after the removing step forming a hard mask in the recess over the first film.

7. The process of claim 4, in which the first trench is shielded from the second etching by a hard mask.

8. The process of claim 6, in which the hard mask is formed with an isotropic oxide etching step.

9. The process of claim 4, in which the second etching step is anisotropic.

10. The process of 6, in which the hard mask exposes a portion of the shoulder of the second trench.

11. The process of claim 4, in which the first distance is equal to the depth of the first trench.

12. The process of claim 4, in which the second distance is equal to the depth of the first trench.

* * * * *